(12) United States Patent
Marshall (10) Patent No.: US 7,489,180 B2
(45) Date of Patent: Feb. 10, 2009

(54) SYSTEMS AND METHODS FOR EFUSE FUSING TIME REDUCTION

(75) Inventor: Andrew Marshall, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 124 days.

(21) Appl. No.: 11/460,666

(22) Filed: Jul. 28, 2006

(65) Prior Publication Data

US 2008/0024196 A1 Jan. 31, 2008

(51) Int. Cl.
*G11C 17/16* (2006.01)
(52) U.S. Cl. .............................. 327/525; 326/38; 365/96
(58) Field of Classification Search .................. 327/525
See application file for complete search history.

(56) References Cited

U.S. PATENT DOCUMENTS 5,311,472 A * 5/1994 Ota ............................ 365/200
5,966,339 A * 10/1999 Hsu et al. ................. 365/225.7
6,111,798 A * 8/2000 Lee ............................. 365/200
6,977,851 B2 * 12/2005 Noguchi ..................... 365/200

* cited by examiner

*Primary Examiner*—Lincoln Donovan
*Assistant Examiner*—Terry L Englund
(74) *Attorney, Agent, or Firm*—Yingsheng Tung; Wade J. Brady, III; Frederick J. Telecky, Jr.

(57) ABSTRACT

Various systems and methods for device configuration are disclosed herein. For example, some embodiments of the present invention provide semiconductor devices that include a fuse blow circuit. The fuse blow circuit provides two fuse blow outputs. Assertion of one of the fuse blow outputs causes one electronic fuse to blow, and assertion of the other fuse blow output causes another electronic fuse to blow. One of the electronic fuses represents a configuration bit while the other electronic fuse represents an inversion status bit indicating an inversion to be applied to the configuration bit. Both the configuration bit and the inversion status bit are applied to an inverter which operates to invert the configuration bit based at least in part on the inversion status bit.

17 Claims, 6 Drawing Sheets

SYSTEMS AND METHODS FOR EFUSE FUSING TIME REDUCTION

BACKGROUND OF THE INVENTION

The present invention is related to systems and methods for developing and testing semiconductor devices, and in particular to systems and methods for utilizing a group of efuses in a semiconductor device.

Figure 1:
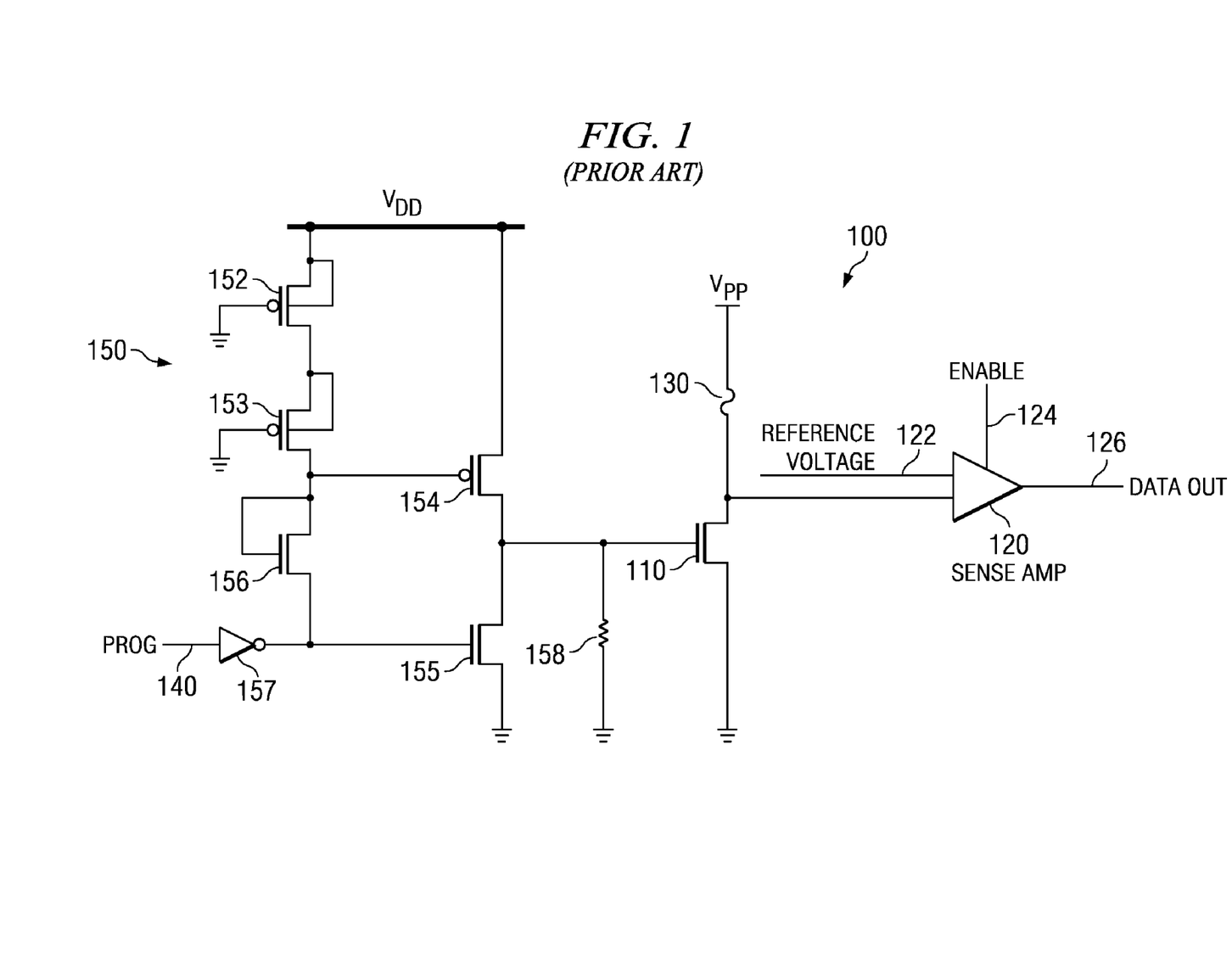
FIG. 1 depicts an existing electronic fuse blow circuit.

Electronic fuses are deployed in various semiconductor devices and allow a semiconductor manufacturer to perform one or more post production customizations of a given semiconductor device. Turning to FIG. 1, a known electronic fuse circuit 100 is depicted. Fuse circuit 100 includes a fuse 130 that is physically connected to a fuse transistor 110. In addition, the output of fuse 130 is physically connected to the input of a sense amplifier 120 that is capable of comparing the output of fuse 130 to a reference voltage 122. Sense amplifier 120 provides a data output 126 that is a binary representation of the state of fuse 130. Sense amplifier 120 includes an enable input 124 that is capable of rendering sense amplifier 120 inoperable. In some cases, enable input 124 is used to disable sense amplifier 120 and thereby reduce power dissipation.

Fuse 130 is blown based on a program input 140 that drives a signaling circuit 150. Signaling circuit 150 includes transistors 152, 153, 154, 155, 156, a buffer 157 and a resistor 158 arranged to assure a proper voltage level and timing required to selectably blow fuse 130 upon the desired assertion of program input 140. In particular, when program input 140 is asserted high (i.e., a logic '1'), the gate of transistor 154 is asserted low (i.e., a logic '0'). This causes the gate of fuse blow transistor 110 to be near $V_{DD}$ (i.e., a logic '1'). Asserting the gate of fuse blow transistor 110 at a logic '1' causes a current driven by $V_{PP}$ to traverse fuse 130 and thereby blow fuse 130. Alternatively, when program input 140 is asserted low, the gate of transistor 154 is asserted high. This causes the gate of fuse blow transistor 110 to be near ground (i.e., a logic '0') and fuse 130 is not blown. Transistors 152, 153 assure a delay upon start-up that limits the possibility that fuse 130 will be blown on power-up when program input 140 is unstable. When fuse 130 is completely blown, a voltage near ground (i.e., a logic '0') is asserted at the output of fuse 130 and the input of sense amplifier 120. In contrast, when fuse 130 is not blown, the output of fuse 130 and the input of sense amplifier 120 is asserted as a voltage near $V_{PP}$ (i.e., a logic '1'). Data output 126 is a binary representation of the voltage at the output of fuse 130.

While fuse blow circuit 100 is capable of blowing fuse 130 under the proper assertion of program input 140, the process of blowing fuse 130 takes a substantial amount of time. For example, the process of blowing fuse 130 can require in excess of ten milliseconds. Where fuse blow circuit is replicated tens, hundreds or even thousands of times, the length of time required to blow a subset of all of the fuses can become significant lasting many seconds or more. The amount of time spent blowing fuses is both costly and distracting.

Thus, for at least the aforementioned reasons, there exists a need in the art for advanced systems and methods for utilizing fuse technology.

BRIEF SUMMARY OF THE INVENTION

The present invention is related to systems and methods for developing and testing semiconductor devices, and in particular to systems and methods for utilizing a group of efuses in a semiconductor device.

Various embodiments of the present invention provide semiconductor devices that include a fuse blow circuit. The fuse blow circuit provides two fuse blow outputs. Assertion of one of the fuse blow outputs causes one electronic fuse to blow, and assertion of the other fuse blow output causes another electronic fuse to blow. One of the electronic fuses represents a configuration bit while the other electronic fuse represents an inversion status bit indicating an inversion to be applied to the configuration bit. Both the configuration bit and the inversion status bit are applied to an inverter which operates to invert the configuration bit based at least in part on the inversion status bit. In some cases, the inverter is an XOR gate. In such cases, one input of the XOR gate is electrically coupled to one of the fuses and the other input is electrically coupled to the other fuse. Thus, where the inversion status bit is set, the configuration bit is inverted. Otherwise, the configuration bit is passed through without being inverted.

In various instances of the aforementioned embodiments, the semiconductor device further includes a sense amplifier. The inputs to the sense amplifier are the configuration bit and a reference voltage. Thus, in some cases, the sense amplifier is operable to provide a binary output based on a comparison with the reference voltage. In some cases, the sense amplifier includes an enable input that can be used to disable operation of the sense amplifier. In one or more cases of the aforementioned embodiments, the fuse blow circuit includes a fuse blow transistor that is electrically coupled to the electronic fuse associated with the configuration bit. When a voltage is applied to the gate of the fuse blow transistor, an electrical current is caused to traverse the electronic fuse and to blow the electronic fuse.

In various cases of the aforementioned embodiments, multiple electronic fuses (i.e., a group of electronic fuses) are associated with multiple configuration bits. In some such cases, outputs associated with one or more of the multiple electronic fuses are sensed and inverted in hardware depending upon the state of the inversion status bit. In other cases, outputs associated with one or more of the multiple electronic fuses are sensed and inverted in software depending upon the state of the inversion status bit. In some cases, one inverter is dedicated to each of the multiple configuration bits, while in other cases an inverter may be used in relation to two or more of the multiple configuration bits. In some cases, one fuse blow transistor is dedicated to each of the multiple configuration bits (i.e., the multiple electronic fuses), while in other cases one fuse blow transistor may be used in relation to two or more of the multiple configuration bits.

Other embodiments of the present invention provide methods for minimizing device configuration time. Such methods include providing an inverter indicating electronic fuse and a plurality of configuration electronic fuses. A first set of the configuration electronic fuses to be blown are identified, and the number of the configuration electronic fuses in the set is determined. In the situation where the number of configuration electronic fuses within the first set is greater than one half the total number of configuration electronic fuses, the inverter indicating electronic fuse is blown along with a second set of configuration electronic fuses. The second set of configuration electronic fuses is exclusive of the first set. Alternatively, where the number of configuration electronic fuses within the first set is less than or equal to one half the total number of configuration electronic fuses, the first set of configuration electronic fuses is blown and the inverter indicating electronic fuse is not blown.

In some instances of the aforementioned embodiments, the methods further include sensing the plurality of configuration electronic fuses and the inverter indicating electronic fuse using a software module, and inverting the plurality of configuration electronic fuses in software based on the state of the inverter indicating electronic fuse. In various instances of the aforementioned embodiments, the methods further include providing an inverter that receives an output indicating the status of the inverter indicating electronic fuse and outputs respectively indicating the status of the plurality of configuration electronic fuses. Each of the plurality of configuration electronic fuses are inverted where the inverter indicating electronic fuse is blown.

Yet other embodiments of the present invention provide configuration circuits. Such configuration circuits include a fuse blow circuit that includes at least two fuse blow transistors. One of the fuse blow transistors is associated with an inverter indicating electronic fuse, and application of a voltage to the gate of the particular fuse blow transistor causes the inverter indicating electronic fuse to blow. The other of fuse blow transistor is associated with one or more configuration electronic fuses, and application of a voltage to the gate of the particular fuse blow transistor causes at least one of the one or more configuration electronic fuses to blow. Such circuits further include an inverter that receives an output associated with the inverter indicating electronic fuse and an output associated with one of the plurality of configuration electronic fuses. When the inverter indicating fuse is blown, the inverter inverts the output associated with the one of the plurality of configuration electronic fuses. In some instances of the aforementioned embodiments, the inverter is an XOR gate with one input of the XOR gate is electrically coupled to the output of the inverter indicating electronic fuse and another input of the XOR gate is electrically coupled to the output of one of the configuration electronic fuses.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for developing and testing semiconductor devices, and in particular to systems and methods for utilizing a group of efuses in a semiconductor device.

Various embodiments of the present invention provide semiconductor devices that include a fuse blow circuit. As used herein, the phrase "fuse blow circuit" is used in its broadest sense to mean any circuit capable of selectably blowing or otherwise opening one or more fuses. Thus, for example, where a fuse selected to be blown is electronic fuse, a fuse blow circuit may consist of circuitry which applies a relatively high voltage across the electronic fuse until an electrical coupling within the electronic fuse is opened. In some cases, one of the fuses accessible via the fuse blow circuit represents a configuration bit while another fuse accessible via the fuse blow circuit represents an inversion status. Such an inversion status bit indicates whether the configuration bit is to be inverted or not. As used herein, the phrase "configuration bit" is used in its broadest sense to mean any bit that indicates configuration of or controls configuration of a device in which the configuration bit is deployed. Thus, for example, a configuration bit may be used to uniquely mark a device for identification. As another example, a configuration bit may be used to enable or disable certain functionality within a device. Both the configuration bit and the inversion status bit are applied to an inverter which operates to invert the configuration bit based at least in part on the inversion status bit. Thus, for example, in one case when the inversion status bit is set in a particular way, the configuration bit is inverted. Alternatively, when the inversion status bit is set in the opposite way, the configuration bit is not inverted. In particular instances of the aforementioned embodiments, the inverter is an XOR gate with the configuration bit and the inverter status bit provided as inputs to the XOR gate. Thus, where the inversion status bit is set, the configuration bit is inverted. Otherwise, the configuration bit is passed through without being inverted. It should be noted that the inverter status bit may be used to control the inversion status of multiple configuration bits. Also, as used herein the phrase "electrically coupled" is used in its broadest sense to mean any coupling whereby an electrical signal from one element can be passed to another element. Thus, for example, two elements are electrically coupled where a conductive wire is placed between the two elements or where a conductive device couples the two elements.

Figure 2:
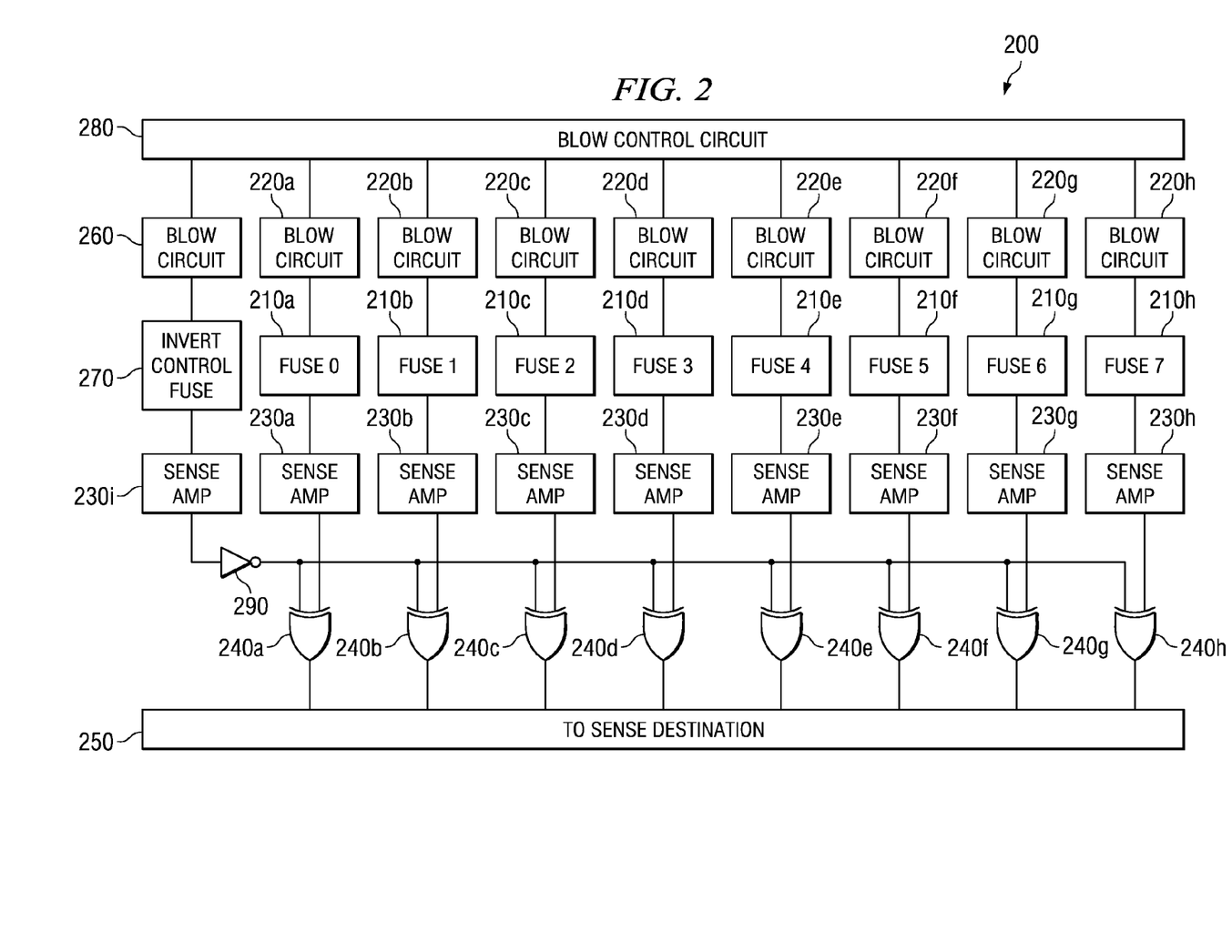
FIG. 2 depicts a fuse circuit in accordance with one or more embodiments of the present invention.

Turning to FIG. 2, a fuse circuit 200 in accordance with one or more embodiments of the present invention is depicted. Fuse circuit 200 includes a number of fuses 210 that can be selectably blown at the direction of a blow control circuit 280 directing respective fuse blow circuits 220. For example, blow control circuit 280 may be communicably or electrically coupled to fuse blow circuit 220a that in turn is electrically coupled to fuse 210a. Upon selection by blow control circuit 280, the circuitry of fuse blow circuit 220a applies the conditions required to get fuse 210a to blow.

Fuses 210 may be any type of fuses that are known in the art. Thus, for example, fuses 210 may be electronic fuses that in some cases may include a material that breaks or is otherwise altered through the application of a voltage for a particular time period. In particular cases, fuses 210 may be a closed circuit when the respective fuse is not blown and an open circuit when the respective fuse is blown. In particular cases, such electronic fuses may be efuses. As used herein, the term "efuses" is uses in its broadest sense to mean any type of electrically programmable fuse. In some cases, the fuses are limited to prior known state fuses.

Fuse blow circuits 220 may be any circuit that is capable of providing conditions necessary to blow the fuse to which the fuse blow circuit is attached. Thus, for example, fuse blow circuits 220 may include transistors 152, 153, 154, 155, 156; buffer 157; resistor 158; and fuse blow transistor 110 arranged as depicted in FIG. 1. Where such is the case, respective program inputs 140 are controlled by blow control circuit 280, and respective ones of fuses 210 are blown based on program input 140 as described above. Based on the disclosure provided herein, one of ordinary skill in the art will recognize a variety of fuse blow circuits that may be implemented and/or utilized in relation to one or more embodiments of the present invention.

Blow control circuit 280 provides programming to blow control circuits 220 that selects which of fuses 210 are to be blown. As just one example, blow control circuit 280 is as simple as a number of I/O each electrically coupled to a respective fuse blow circuit 220. As another example, blow control circuit 280 may consist of a number of registers accessible via a hardware and/or software interface. Each of the registers may be electrically coupled to one of fuse blow circuits 220 (or multiplexed to two or more fuse blow circuits depending upon the particular design) such that when a particular register is set a fuse associated with the register is blown. Based on the disclosure provided herein, one of ordinary skill in the art will recognize a variety of circuits that may be implemented and/or utilized to perform the functions of blow control circuit 280. While fuse circuit 200 is shown as having eight fuses 210, any number of fuses may be included in fuse circuit 200.

Each of fuses 210 is electrically coupled to a respective sense amplifier 230. Thus, for example, fuse 210a is electrically coupled to sense amplifier 230a. In some cases, fuses 210 may only partially blow when it was intended to completely blow the fuse. In such cases, a voltage indicative of a partially blown fuse is sensed at the output of the fuse rather than a circuit open as would be expected whenever a fuse is blown. In such cases, it is desirable to identify a partially blown fuse as a circuit open and to provide a binary output indicative of such a fuse output. Sense amplifiers 230 provide this function by sensing the output of a particular fuse and representing the output as either a logic '1' or a logic '0'. Thus, sense amplifiers 230 can be any circuit or device that is capable of detecting a voltage level at the output of fuses 210 and providing a binary representation thereof. Thus, for example, sense amplifiers 230 may comprise a comparator with the other input of the comparator coupled to a reference voltage such as that shown in FIG. 1. Based on the disclosure provided herein, one of ordinary skill in the art will recognize a variety of circuits that may be used to perform the functions of sense amplifiers 230. Alternatively, sense amplifiers may be eliminated altogether in some embodiments of the present invention.

Another fuse blow circuit 260 is directed by blow control circuit 280 to control the blowing of an invert control fuse 270. In some cases, fuse blow circuit 260 is essentially the same circuit used to implement fuse blow circuits 220, and invert control fuse 270 is the same type of fuse used for fuses 210. In other cases, fuse blow circuit 260 and invert control fuse 270 may be different from their counterparts while providing essentially the same functionality. In operation, invert control fuse 270 dictates the status (either inverted or non-inverted) of each of fuses 210.

The outputs from each of fuses 210 (via sense amplifiers 230) along with the output from invert control fuse 270 (via sense amplifier 230i) are provided to respective inverters 240. Inverters 240 operate to invert the output of each of sense amplifiers 230 based on the output of invert control fuse 270. As depicted, inverters 240 are implemented as XOR gates with one input electrically coupled to the output of invert control fuse 270 (via a sense amplifier 230i and an inverter 290) and the other input is electrically coupled to an output of one of the configuration fuses 210 (via a respective sense amplifier 230). Thus, in operation when invert control fuse 270 is not blown (i.e., the invert input provided to each of inverters is a logic '0') the outputs from sense amplifiers 230 are not inverted by inverters 240. Alternatively, in operation when invert control fuse 270 is blown (i.e., the invert input provided to each of inverters is a logic '1') the outputs from sense amplifiers 230 are inverted by inverters 240. Based on the disclosure provided herein, one of ordinary skill in the art will appreciate other devices and/or circuits that may be used to implement inverters 240. As just one example, a combination of an inverter and a multiplexer may be used with a non-inverted output from sense amplifiers 230 electrically coupled to one of the multiplexer inputs and an inverted version of the output from sense amplifiers 230 electrically coupled to the other multiplexer input. The output from invert control fuse 270 is electrically coupled to the selector of the multiplexer. Alternatively, inverters 140 may be implemented in software or firmware.

The outputs of inverters 240 are provided to a sense destination 250. Sense destination 250 may be any device or circuit that is capable of sensing and/or utilizing the information obtained from the various fuses 210. As one example, sense destination is a memory circuit capable of sensing and storing the fuse outputs. This process may be performed only once upon power-up with the fuse information being accessible by software accessing the device during the period of device operation. In such cases, other parts of fuse circuit 200 may be disabled to conserve energy. Such an approach may include disabling sense amplifiers 230 as discussed above in relation to FIG. 1. Based on the disclosure provided herein, one of ordinary skill will recognize various other circuits may be use to implement sense destination 250. For example, sense destination 250 may include a number of I/O that are accessible. As another example, sense destination 250 may include a register that may be serially read using software via a register or I/O.

Fuse circuit 200 may be used to advantageously limit the amount of time required to set the status of configuration fuses 210. In particular, where more than half of fuses 210 are to be blown, invert control fuse 270 is blown and an opposite set of fuses 210 are blown. On the other hand, where less than half of fuses 210 are to be blown, invert control fuse 270 is not blown. As a specific example, assume that fuses 210a, 210b, 210c, 210d, 210e (five of the eight depicted fuses) are to be blown and fuses 210f, 210g, 210h (three of the eight depicted fuses) are not to be blown. In this example, more than half of the total number of fuses 210 are to be blown. As such, invert control fuse 270 would be blown along with fuses 210f, 210g, 210h. Fuses 210a, 210b, 210c, 210d, 210e would not be blown. Because invert control fuse 270 is blown and the operation of inverters 240, the output provided to sense destination is the same is it would have been if fuses 210a, 210b, 210c, 210d, 210e had been blown, yet it required blowing only four fuses (fuses 210f, 210g, 210h and invert control fuse 270) instead of the originally intended five fuses. In contrast, assume that fuses 210a, 210b (two of the eight depicted fuses) are to be blown and fuses 210c, 210d, 210e, 210f, 210g, 210h (six of the eight depicted fuses) are not to be blown. In this example, half or less of the total number of fuses 210 are to be blown. As such, invert control fuse 270 is not blown, but fuses 210a, 210b are blown. This approach on average reduces the number of fuses that must be blown and thus the time required to configure a particular device. This savings can be dramatic where thousands of fuses are used to configure a particular device. The following equation calculates time savings achieved where the number of fuses to be blown is greater than one half the total number of fuses:

$$T_{Savings} = [2*(\text{Fuses to be Blown}) - (\text{Total Fuses}) - 1] \cdot (\text{Time to Blow a Fuse}),$$

Where (Fuses to be Blown) is the total number of fuses that are originally intended to be blown, (Total Fuses) is the overall number of fuses in the circuit, and (Time to Blow a Fuse) is the average time required to blow an individual fuse. The following table shows multiple concrete examples of time saved using embodiments of the present invention based on the preceding formula:

| Total Fuses | Fuses to be Blown | Time to Blow a Fuse | Time Savings |
|---|---|---|---|
| 11 | 6 | 10 ms | 0 |
| 125 | 65 | 10 ms | 40 ms |
| 1134 | 1130 | 10 ms | 11.25 s |

In some cases, the decision of whether to blow invert control fuse 270 and an inverted set of fuses 210 is made in software and is implemented through control of blow control circuit 280. In such cases, the software calculates the total number of fuses and the number of fuses to be blown. Where the number of fuses to be blown is greater than half the total number of fuses, the software programs blow control circuit 280 to blow invert control fuse 270, and to blow an inverted set of configuration fuses 210.

In other cases, the decision of whether to blow invert control fuse 270 and an inverted set of fuses 210 is made in hardware by blow control circuit 280. In such a case, blow control circuit includes an summer capable of determining the total number of fuses to be blown, and a comparator that compares the total number of fuses to be blown with a one half of the known number of fuses. Where the comparison indicates that more than half of the fuses are to be blown, blow control circuit 280 inverts program control signals provided to fuse blow circuits 220 and asserts the program control signal provided to fuse blow circuit 260.

Figure 3:
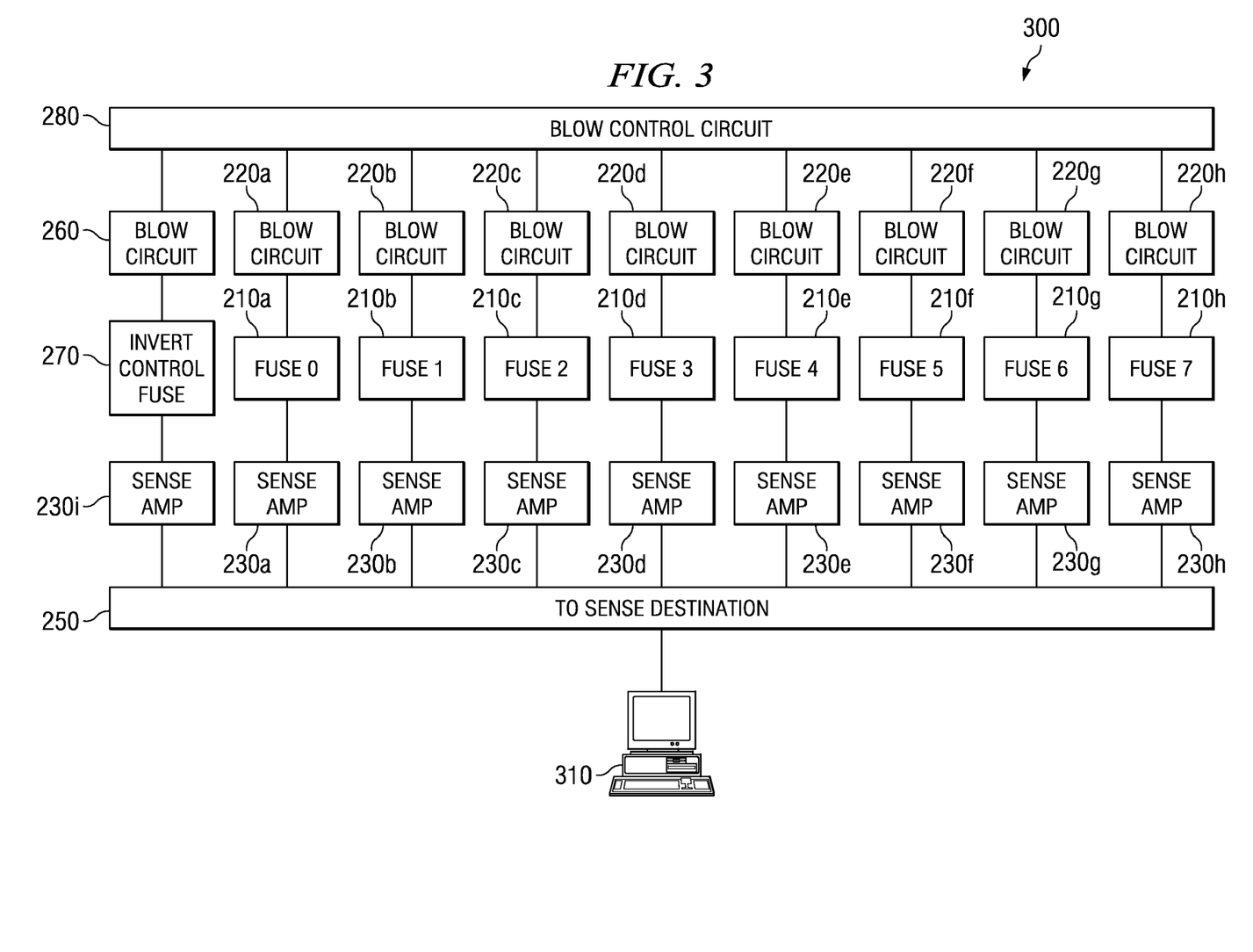
FIG. 3 depicts another fuse circuit in accordance with other embodiments of the present invention.

Turning to FIG. 3, a fuse circuit 300 in accordance with other embodiments of the present invention is depicted. Fuse circuit 300 is substantially the same as fuse circuit 200 except that inverters 240 are implemented in software running on a computer 310 that includes an interface to sense destination 250. The software based inverter receives the outputs from fuses 210 and the output of invert control fuse 270. The software inverter inverts fuse outputs 210 whenever invert control fuse 270 is blown. In such cases, an invert pattern is applied causing all of the fuse outputs to be inverted. Based on the disclosure provided herein, one of ordinary skill in the art will recognize that computer 310 may be any processor based machine capable of implementing an invert pattern as described above. Thus, for example, computer 310 may be a personal computer with an interface to fuse circuit 300. As another example, computer 310 may be a processor executing firmware and imbedded on the same semi-conductor device with fuse circuit 300.

Figure 4:
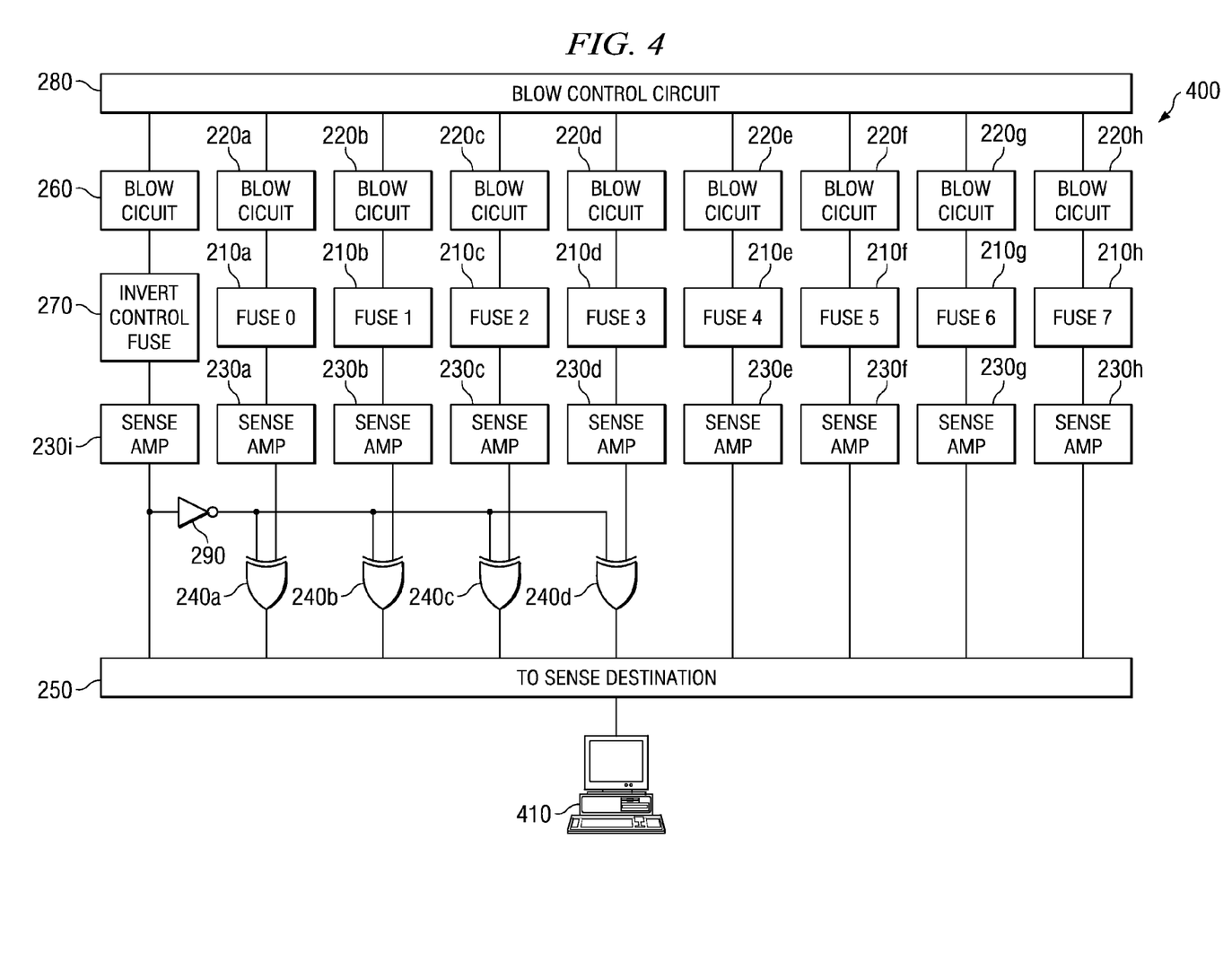
FIG. 4 depicts another fuse circuit in accordance with yet other embodiments of the present invention.

Turning to FIG. 4, a fuse circuit 400 in accordance with yet other embodiments of the present invention is depicted. Fuse circuit 400 is substantially the same as fuse circuit 200 except that a portion of inverters 240 are implemented in software running on a computer 410 that includes an interface to sense destination 250. Thus, in this case, the inverter is implemented in a combination of hardware and software. In particular, outputs from fuses 210a, 210b, 210c, 210d are inverted by respective hardware inverters 240a, 240b, 240c, 240d whenever invert control fuse 270 is blown. In contrast, outputs from fuses 210e, 210f, 210g, 210h are inverted in software operating on computer 410 whenever invert control fuse 270 is blown. In such cases, an invert pattern is applied causing some bits to be inverted and others not to be inverted. Based on the disclosure provided herein, one of ordinary skill in the art will recognize that computer 410 may be any processor based machine capable of implementing an invert pattern as described above. Thus, for example, computer 410 may be a personal computer with an interface to fuse circuit 400. As another example, computer 410 may be a processor executing firmware and imbedded on the same semi-conductor device with fuse circuit 400.

Figure 5:
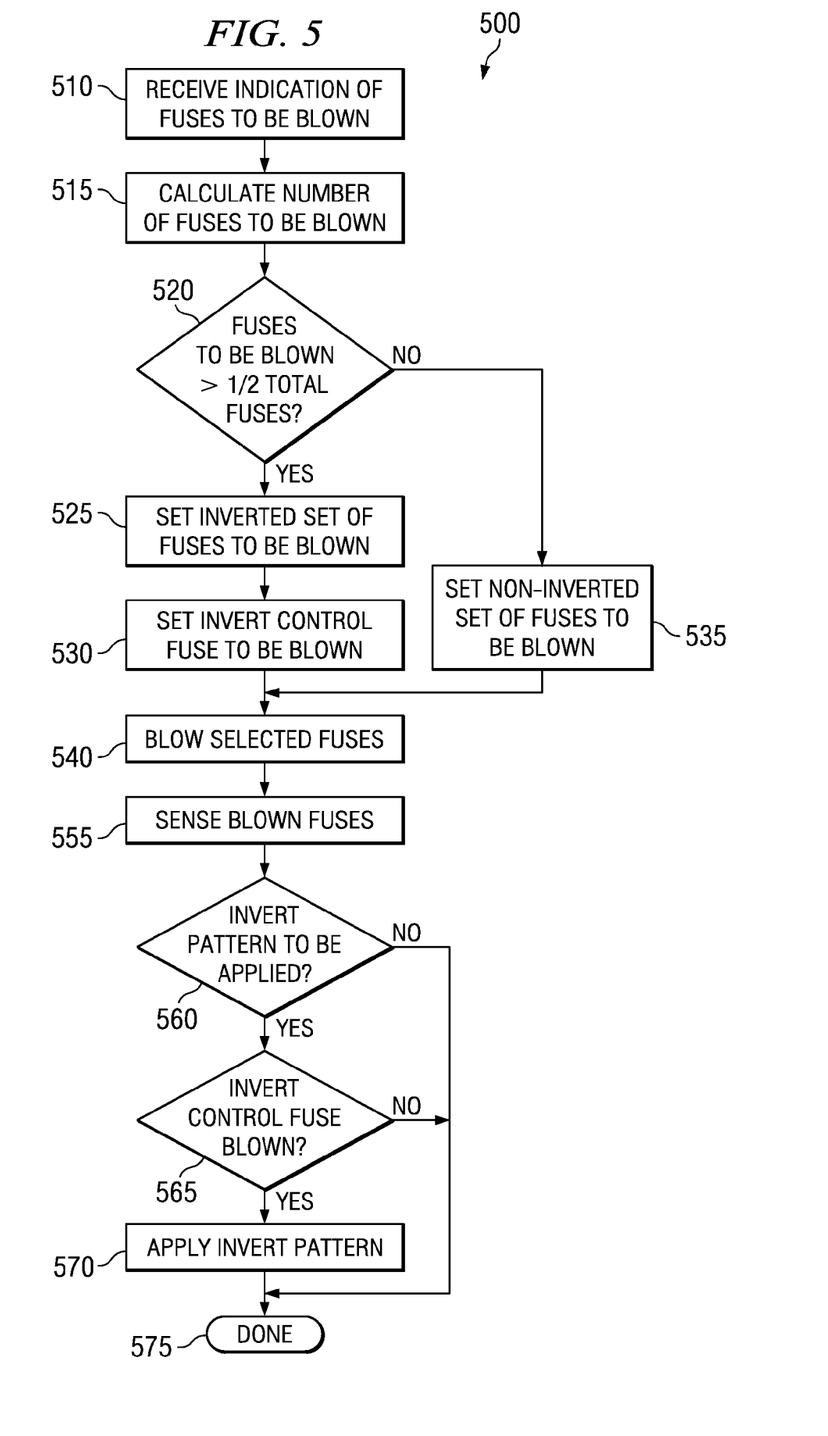
FIG. 5 is a flow diagram depicting software, firmware and/or hardware processing in accordance with one or more embodiments of the present invention.

Operation of fuse circuits 200, 300, 400 in accordance with some embodiments of the present invention is depicted in a flow diagram 500 of FIG. 5. It should be noted that the operation depicted in flow diagram 500 could be implemented in software, hardware, firmware or some combination thereof. Following flow diagram 500, an indication of which fuses are to be blown is received (block 510). This may include a listing of all fuses implemented in a particular device with fuses that are to be blown associated with a logic '1' and all other fuses associated with a logic '0'. Next, the total number of fuses to be blown is calculated (block 515). This may be done, for example, by summing each of the fuses marked with a logic '1'. Next it is determined whether the number of fuses to be blown is greater than half of the total number of fuses available (block 520). Where the total number of fuses to be blown is greater than half of the total number of fuses available (block 520), the pattern of fuses to be blown is inverted (block 525). Thus, where a particular fuse was originally set to be blown it is changed so that it will not be blown, and where another fuse was originally set not to be blown it is changed so that it will be blown. In addition, the invert control fuse is set to be blown (block 530). Alternatively, where the total number of fuses to be blown is less than or equal to the total number of fuses available (block 520), the pattern of fuses to be blown remains the same as originally directed (block 535).

The fuses are then blown using the pattern determined in the aforementioned steps (block 540). This process is accomplished by blow control circuit 280 asserting the various program input lines provided to the respective fuse blow circuits 220 that in turn cause fuses 210 to be selectably blown. At this point, the device has been configured. The configuration may then be sensed by sensing the status of each of fuses 210 via sense destination 250 (block 555). As previously discussed, this may include, for example, reading the fuse status into some form of a memory and/or utilizing a computer to record the fuse status in software. Where a computer is used to sense the fuse status, the computer (or imbedded processor) may provide the inverter. In this case, it may be determined whether an invert pattern is to be applied (block 560). An invert pattern may be applied where it is sensed that invert control fuse is blown, and that one or more of the outputs of fuses 210 are relying on a software inverter rather than a hardware inverter. Thus, where it is determined that an invert pattern may be applied (block 560), it is next determined if invert control fuse 270 has been blown (block 565). Where invert control fuse 270 has been blown (block 565) and an invert pattern is to be applied (block 560), an invert pattern is applied (block 570). Otherwise, no software inversion is performed and the process is completed (block 575). It should be noted that the invert pattern may invert some subset of all of the sensed fuse outputs as would the case with fuse circuit 400 or all of the sensed fuse outputs as would be the case with fuse circuit 300. Such a software (or firmware) inverter can, for example, simply use the inverter pattern as a mask performing an XOR function with the sensed value of invert control fuse 270.

Figure 6:
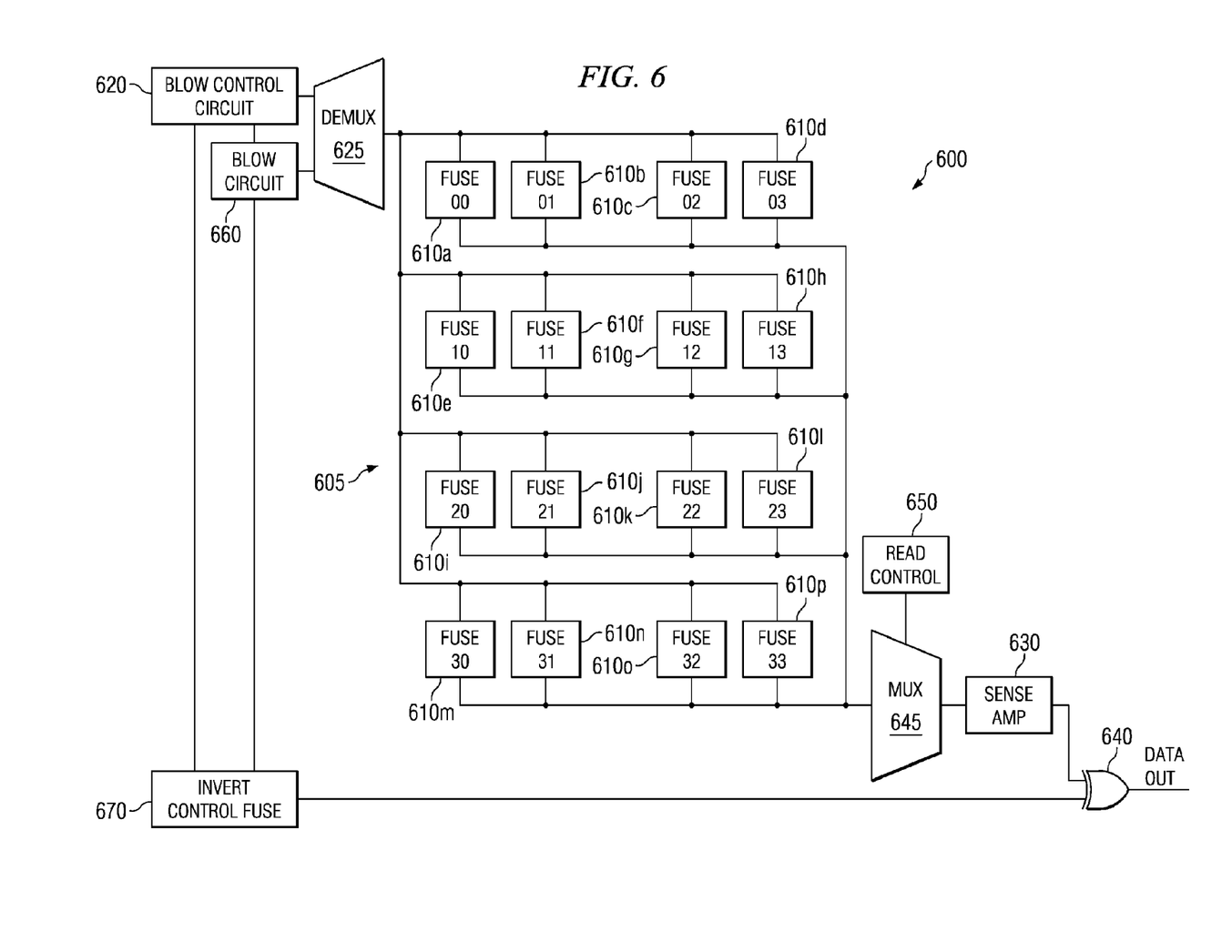
FIG. 6 depicts an array type fuse circuit in accordance with yet other embodiments of the present invention.

Turning now FIG. 6, an array type fuse circuit 600 in accordance with various embodiments of the present invention is depicted. Fuse circuit 600 includes an addressable array 605 of multiple fuses 610. Fuses 610 may be similar to fuses 210 described above. A demultiplexer 625 is used to address one or more of fuses 610 according to instructions from a blow control circuit 620, and to electrically couple the addressed fuses 610 to a fuse blow circuit 660. Blow control circuit 620 provides programming to demultiplexer 625 that selects which of fuses 610 are to be blown. As one example, blow control circuit 620 may be an interface that interacts with a processor running either firmware or software and capable of receiving fuse blow information from the processor and passing the fuse blow information to demultiplexer 625. Based on the disclosure provided herein, one of ordinary skill in the art will recognize a variety of circuits that may be implemented and/or utilized to perform the functions of blow control circuit 620.

When one or more fuses 610 are addressed and fuse blow circuit 660 is asserted, the addressed fuses 610 in addressable array 605 are blown. Similarly, when blow control circuit 620 selects an invert control fuse 670 and fuse blow circuit 660 is enabled, invert control fuse 670 is blown. Fuse blow circuit 660 may be any circuit that is capable of providing conditions necessary to blow the fuse to which the fuse blow circuit is attached. Thus, for example, fuse blow circuit 660 may include transistors 152, 153, 154, 155, 156; buffer 157; resistor 158; and fuse blow transistor 110 arranged as depicted in FIG. 1. Where such is the case, program input 140 is provided by blow control circuit 620 and the addressing selects via demux 625 which of fuses 610 are blown. Based on the disclosure provided herein, one of ordinary skill in the art will recognize a variety of fuse blow circuits that may be implemented and/or utilized in relation to one or more embodiments of the present invention.

After the appropriate fuses 610, 670 are blown, the outputs of the individual fuses 610 from addressable array 605 can be sensed via a multiplexer 645 under the direction of a read control circuit 650. The addressed output value is provided from multiplexer 645 to a sense amplifier 630. In some cases, fuses 610 may only partially blow when it was intended to completely blow the fuse. In such cases, a voltage indicative of a partially conductive fuse is sensed at the output of the partially blown fuse rather than a circuit open as would be expected whenever a fuse is blown. In such cases, it is desirable to identify a partially blown fuse as a circuit open and to provide a binary output indicative of the fuse output. Sense amplifier 630 provides this function by sensing the output of an addressed fuse and represents the output as either a logic '1' or a logic '0'. Thus, sense amplifiers 630 can be any circuit or device that is capable of detecting a voltage level at the output of an addressed fuse 610 and providing a binary representation thereof. Thus, for example, sense amplifier 630 may comprise a comparator with the other input of the comparator coupled to a reference voltage such as that shown in FIG. 1. Based on the disclosure provided herein, one of ordinary skill in the art will recognize a variety of circuits that may be used to perform the functions of sense amplifier 630. Alternatively, sense amplifier 630 may be eliminated altogether in some embodiments of the present invention. An inverter 640 selectably applies inversion of the addressed fuse output depending upon the state of invert control fuse 670.

Statistical analysis suggests that smaller arrays of fuses may provide somewhat better time efficiency when compared to larger arrays. For example, an analysis of fusing time versus a completely random fusing regime was performed. The same analysis was performed for arrays of one thousand fuses using a number of invert control fuses assigned to different blocks of fuses within the array. Thus, for example, one array of one thousand fuses is controlled by a single invert control fuse, and in another case an array of one thousand fuses is broken into two blocks of five hundred fuses with each block being controlled by a different invert control fuse. The following table shows the results of the analysis:

| Total Fuses in the Array | Fuses Per Block | Invert Control Fuses | Time Savings |
| --- | --- | --- | --- |
| 1000 | 1000 | 1 | 2.9% |
| 1000 | 500 | 2 | 4.2% |
| 1000 | 250 | 4 | 4.6% |
| 1000 | 125 | 8 | 2.4% |
| 1000 | 60+ | 16 | −14% |

Hence, in some embodiments of the present invention, a large array of fuses is broken into smaller blocks with each of the smaller blocks being governed by an individually programmable invert control fuse.

In conclusion, the present invention provides novel systems, devices, methods and arrangements for utilizing efuses. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A semiconductor device comprising:
   a fuse blow circuit providing a first fuse blow output and a second fuse blow output and an inverter control fuse blow output;
   a first configuration electronic fuse operable to blow upon assertion of the first fuse blow output, and providing a first fuse output;
   a second configuration electronic fuse operable to blow upon assertion of the fuse blow output, and providing a second fuse output;
   an inverter indicating electronic fuse operable to blow upon assertion of the inverter control fuse blow output, and providing an inverter fuse output;
   a first inverter inverting the first fuse output based at least in part on the inverter fuse output; and
   a second inverter inverting the second fuse output based at least in part on the inverter fuse output.

2. The semiconductor device of claim 1, wherein the first inverter includes an XOR gate, wherein one input of the XOR gate is the first fuse output, and wherein another input of the XOR gate is the inverter fuse output.

3. The semiconductor device of claim 1 further comprising a sense amplifier operable to compare the first fuse output and a reference voltage.

4. The semiconductor device of claim 3, wherein the sense amplifier further includes an enable input, and wherein the enable input is operable to disable operation of the sense amplifier.

5. The semiconductor device of claim 1, wherein the fuse blow circuit includes a fuse blow transistor.

6. The semiconductor device of claim 1, further comprising at least a third configuration electronic fuse having a third fuse output, and and a software program, which is operable to convert a value representative of the third fuse output based at least in part on a value representative of the inverter fuse output.

7. The semiconductor device of claim 1, wherein the fuse blow circuit is an integrated fuse blow circuit operable to blow both the first configuration electronic fuse and the second configuration electronic fuse.

8. The semiconductor device of claim 7, wherein the fuse blow circuit includes:
 a first fuse blow transistor, wherein the first fuse blow transistor is electrically coupled to the first configuration electronic fuse, and wherein applying a voltage to a gate of the first fuse blow transistor causes an electrical current to traverse the first configuration electronic fuse causing the first configuration electronic fuse to blow;
 a second fuse blow transistor, wherein the second fuse blow transistor is electrically coupled to the second configuration electronic fuse, and wherein applying a voltage to a gate of the second fuse blow transistor causes an electrical current to traverse the second configuration electronic fuse causing the second configuration electronic fuse to blow; and
 wherein the first fuse blow output is applied to the gate of the first fuse blow transistor and to the gate of the second fuse blow transistor.

9. The semiconductor device of claim 8, wherein the first fuse blow output is applied to the gate of the first fuse blow transistor and to the gate of the second fuse blow transistor via a demultiplexer.

10. The semiconductor device of claim 1, wherein the fuse blow circuit includes:
 a fuse blow transistor, wherein the fuse blow transistor is electrically coupled to the first configuration electronic fuse and to the second configuration electronic fuse via a demultiplexer;
 wherein selecting the first configuration electronic fuse via the demultiplexer and asserting the first fuse blow output causes the first configuration electronic fuse to blow; and
 wherein selecting the second configuration electronic fuse via the demultiplexer and asserting the first fuse blow output causes the second configuration electronic fuse to blow.

11. A method for reducing device configuration time, the method comprising:
 providing an inverter indicating electronic fuse;
 providing a plurality of configuration electronic fuses with a total number;
 identifying a first set of the plurality of configuration electronic fuses to be blown;
 counting the first set of the configuration electronic fuses and determining the count to be greater than one half of the total number of configuration electronic fuses; and
 blowing the inverter indicating electronic fuse and the configuration electronic fuses exclusive of the first set.

12. The method of claim 11, wherein the method further comprises:
 sensing the plurality of configuration electronic fuses and the inverter indicating electronic fuse using a software module; and
 inverting the plurality of configuration electronic fuses in software based on the state of the inverter indicating electronic fuse.

13. The method of claim 11, further comprising inverting each of the plurality of configuration electronic fuses.

14. The method of claim 13, wherein the inverting is performed by a plurality of XOR gates with one XOR gate associated with each configuration electronic fuse in the plurality of configuration electronic fuses, wherein one input of each of the XOR gates is electrically coupled to an output indicating the status of the inverter indicating electronic fuse and another input of each of the XOR gates is electrically coupled to an output indicating the status of respective ones of the plurality of configuration electronic fuses.

15. The method of claim 11, wherein each of the configuration electronic fuses is associated with a respective fuse blow transistor.

16. The method of claim 11, wherein each of the configuration electronic fuses is associated with a respective sense amplifier.

17. The method of claim 11, wherein each of the configuration electronic fuses is associated with a common sense amplifier and a common fuse blow transistor.

* * * * *